United States Patent
Okayama

(10) Patent No.: US 10,192,623 B2
(45) Date of Patent: Jan. 29, 2019

(54) SEMICONDUCTOR DEVICE

(71) Applicant: Renesas Electronics Corporation, Tokyo (JP)

(72) Inventor: Shota Okayama, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/801,182

(22) Filed: Nov. 1, 2017

(65) Prior Publication Data
US 2018/0151228 A1    May 31, 2018

(30) Foreign Application Priority Data
Nov. 30, 2016 (JP) .................................. 2016-233487

(51) Int. Cl.
| | |
|---|---|
| *G11C 16/10* | (2006.01) |
| *G11C 16/04* | (2006.01) |
| *G11C 16/14* | (2006.01) |
| *G11C 16/30* | (2006.01) |
| *G11C 16/34* | (2006.01) |
| G11C 16/32 | (2006.01) |
| G11C 16/06 | (2006.01) |
| H01L 29/788 | (2006.01) |
| H01L 27/11568 | (2017.01) |

(52) U.S. Cl.
CPC .......... *G11C 16/10* (2013.01); *G11C 16/0408* (2013.01); *G11C 16/14* (2013.01); *G11C 16/30* (2013.01); *G11C 16/3459* (2013.01); *G11C 16/06* (2013.01); *G11C 16/32* (2013.01); *H01L 27/11568* (2013.01); *H01L 29/7883* (2013.01)

(58) Field of Classification Search
CPC ......... G11C 16/06; G11C 16/10; G11C 16/14; G11C 16/30; G11C 16/32; G11C 16/3459; G11C 16/0408; H01L 27/11568; H01L 29/7883
USPC .......................... 365/185.22, 185.23, 189.09
See application file for complete search history.

(56) References Cited

U.S. PATENT DOCUMENTS 9,177,657 B2 * 11/2015 Ogawa .................... G11C 16/14
2013/0132670 A1 * 5/2013 Nishikawa ........... G11C 11/5628
711/114

(Continued)

FOREIGN PATENT DOCUMENTS

JP    WO2014/033851 A1    8/2016

*Primary Examiner* — Tan T. Nguyen
(74) *Attorney, Agent, or Firm* — McGinn IP Law Group, PLLC.

(57) ABSTRACT

A semiconductor device includes a memory unit and a control unit which controls the memory unit. The memory unit a memory which is configured with a non-volatile memory device, and stores setting information necessary for rewriting, a first control circuit which has a first register and a rewrite end flag, and a power source circuit which generates a rewrite voltage. The control unit includes a second control circuit which has a rewrite start flag, a counter which measures a rewrite voltage application time based on the rewrite start flag and the rewrite end flag, and a second register which stores a next rewrite voltage based on the rewrite voltage application time. When a command for rewriting the memory is received, the control unit reads the setting information necessary for rewriting from the memory, and writes it back to the first register.

18 Claims, 16 Drawing Sheets

(56) References Cited

U.S. PATENT DOCUMENTS

2013/0155773 A1* 6/2013 Miyamoto .............. G11C 16/06
                                                         365/185.12
2015/0131384 A1    5/2015 Ogawa et al.

* cited by examiner

F I G . 5
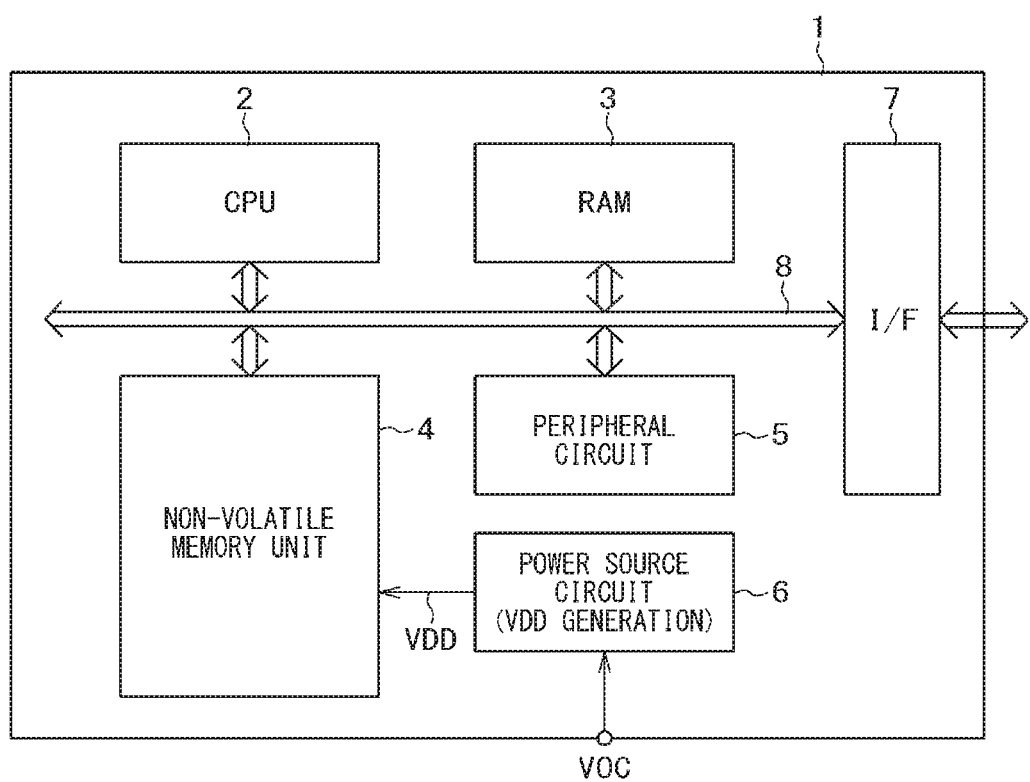

SEMICONDUCTOR DEVICE

CLAIM OF PRIORITY

The present application claims priority from Japanese Patent application JP 2016-233487 filed on Nov. 30, 2016, the content of which is hereby incorporated by reference into this application.

BACKGROUND

The present invention relates to a semiconductor device, and is applicable to a semiconductor device incorporating an electrically rewritable non-volatile memory, such as a flash memory.

Recently, flash memories are widely used as devices which store programs or data. The flash memories are electrically rewritable non-volatile memory units. The flash memories are memory units which can erase/write the storage contents many times, by increasing a voltage to be applied at the time of rewriting higher than a voltage at the time of reading. That is, rewriting is performed by applying a pulse-like voltage to the memory unit, and by controlling a current to flow through a gate insulating film to inject electrons to the memory unit and draw out the electrons.

In this manner, deterioration of the flash memory cannot be avoided in nature, because it is necessary to cause a current to flow through the gate insulating film every time the rewriting is performed. As a result, the flash memory cannot be rewritten as the deterioration of the deterioration of the memory unit progresses. One feature thereof is that there is a limit of the number of rewriting. Thus, it is important to provide a technique for applying an appropriate pulse voltage with an appropriate pulse with, to the memory unit at the time of rewriting.

WO2014/033851 discloses that "in a semiconductor device, when erasing data by using a band-to-band tunneling method, the supply of a boosted voltage to a memory cell to be erased is terminated if, in addition to the condition that the output voltage of a charge pump circuit has recovered to a predetermined criterion voltage, another condition is satisfied that a predetermined criterion time has elapsed from the start of supply of the boosted voltage to the memory cell to be erased."

SUMMARY

However, to realize the technique of WO 2014/033851, it is necessary to prepare a voltage setting table at the time of erasing the output voltage value of the charge pump circuit or the memory gate voltage value, which are set for each cycle. If the set voltages are specifically determined, the table scale is enlarged. When this table is stored in the memory area of the non-volatile memory, such as the flash memory, its area is undesirably enlarged.

Other objects and new features will be apparent from the following description of the present specification and the accompanying drawings.

Of the present disclosure, the typical scheme will briefly be described as follows.

That is, the semiconductor device measures a rewrite voltage application time for the non-volatile memory, and determines the next rewrite voltage based on the measured time.

According to the above-described semiconductor device, it is possible to reduce the size of a rewrite voltage table.

BRIEF DESCRIPTION OF THE DRAWINGS

FIG. 5 is a block diagram illustrating a configuration of a semiconductor device according to an embodiment.

DESCRIPTIONS OF THE PREFERRED EMBODIMENT

Descriptions will now be made to a preferred embodiment by reference to the accompanying drawings. In the descriptions below, the same constituent elements are identified by the same reference symbols, and thus may not be described over and over.

Figure 1:
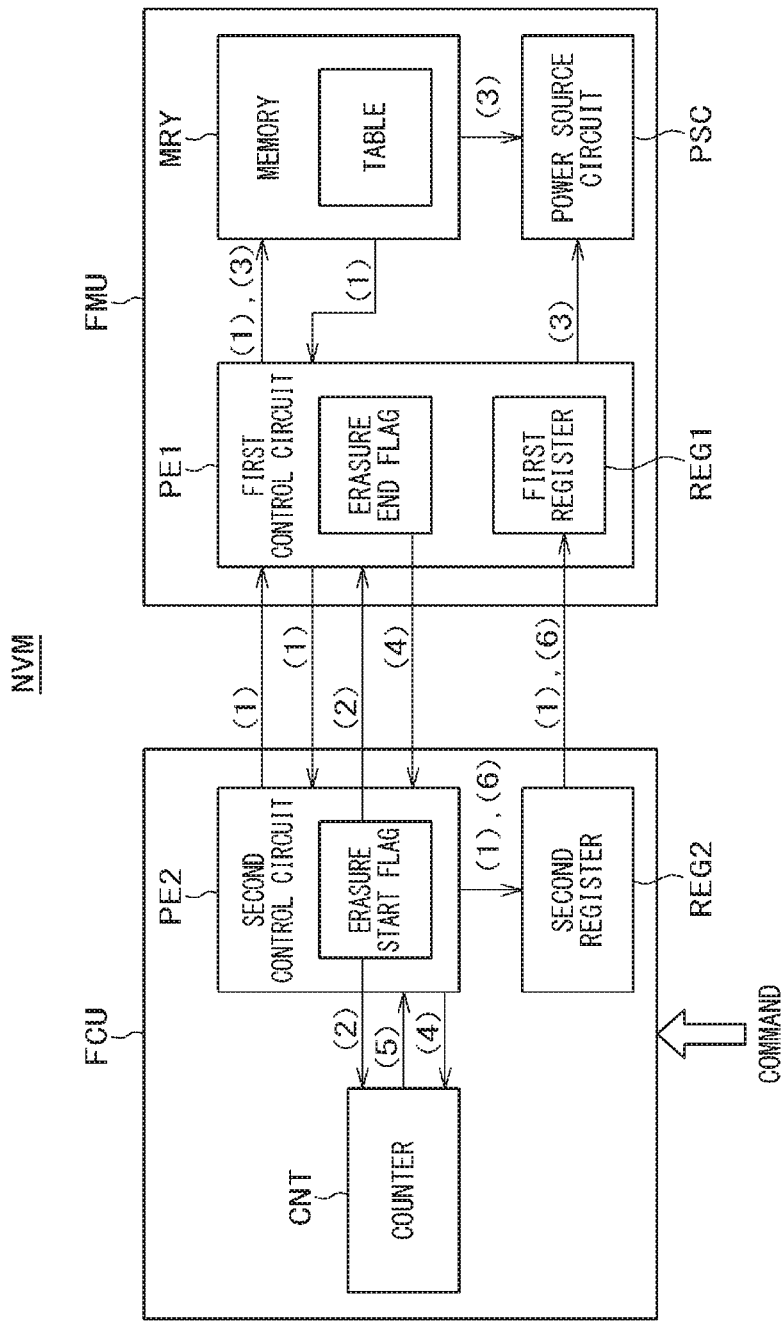
FIG. 1 is a block diagram for explaining a configuration and an operation of a non-volatile memory unit according to an embodiment 1.
Figure 2:
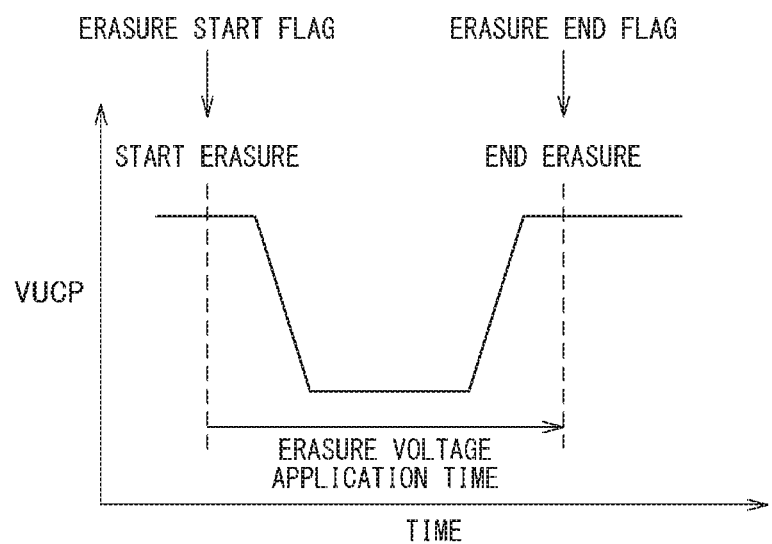
FIG. 2 is a diagram illustrating a waveform of an erasure voltage.
Figure 3:
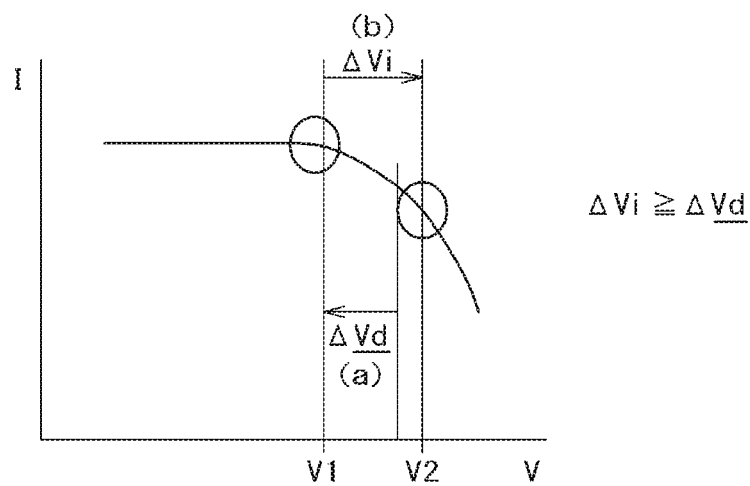
FIG. 3 is a diagram illustrating a voltage-current characteristic of a charge pump circuit of a power source circuit.

Descriptions will now be made to a non-volatile memory unit as a semiconductor device according to an embodiment, using FIG. 1 to FIG. 4. FIG. 1 is a block diagram for explaining a configuration and an operation of the non-volatile memory unit according to the embodiment. FIG. 2 is a diagram illustrating a waveform of an erasure voltage. FIG. 3 is a diagram illustrating a voltage-current characteristic of a charge pump circuit of a power source circuit.

A non-volatile memory unit NVM according to the embodiment includes a memory unit FMU and a control unit FCU. The memory unit FMU includes a memory MRY, a first control circuit PE1 having a first register REG1, and a power source circuit PSC. When the non-volatile memory unit NVM includes a plurality of memory units FMU, the power source circuit PSC is shared. That is, each of the memory units FMU does not have to include a power source circuit PSC. The control unit FCU includes a second control circuit PE2, a second register REG2, and a counter CNT measuring an erasure voltage application time. The memory MRY includes a memory array and its peripheral circuits, and stores initial setting information (a table) which is necessary for rewriting (including erasure). To perform rewriting of the memory, the control unit FCU reads data of the table in the memory MRY, and writes it back to the first register REG1 in the memory unit FMU. In the rewriting of the memory, an erasure operation and a writing operation for the memory are performed.

The memory MRY has, for example, a charge accumulation unit, and includes a memory cell transistor storing data based on a change in a threshold voltage in accordance with a charge amount of the charge accumulation unit. The power source circuit PSC includes, for example, a voltage generation circuit and a detection circuit. The voltage generation circuit generates a rewrite voltage to be supplied to one main electrode of the memory cell transistor at the time of a rewriting operation. The detection circuit detects an output voltage of the voltage generation circuit, and compares it with a reference value.

Descriptions will now be made to an erasure operation of the non-volatile memory unit NVM.

(1) The control unit FCU externally receives an erasure command from the CPU, performs controlling for initial setting data necessary for the erasure to be transferred from the memory MRY in the memory unit FMU to the control unit FCU, and stores the data in the second register REG2 in the control unit FCU. After this, the control unit FCU writes back the initial setting information (initial erasure voltage information) in the second register REG2 into the first register REG1 in the first control circuit PE1 of the memory unit FMU.

(2) The second control circuit PE2 of the control unit FCU issues an erasure start flag to the memory unit FMU and a counter CNT in the control unit FCU. As a result, the memory unit FMU starts an erasure operation, and the counter CNT in the control unit FCU starts a counting operation.

(3) The memory unit FMU controls the power source circuit PSC based on the erasure start flag and the information written in the first register REG1, to perform the erasure for the memory cell transistor of the memory MRY. For example, the first control circuit PE1 supplies an erasure voltage based on the erasure start flag to the main electrode of the memory cell transistor.

(4) After the first control circuit PE1 of the memory unit FMU detects the end of the first erasure operation, it issues an erasure end flag to the control unit FCU. In the end of the erasure operation, it is detected that the erasure application voltage has returned to the initial voltage. For example, the detection circuit detects that the erasure voltage is greater than a reference value, sets an end flag, and stops supplying the erasure voltage. Then, the second control circuit PE2 of the control unit FCU stops the counter CNT in the control unit FCU, and measures an erasure voltage application time (Tp) corresponding to the counter number.

(5) The counter CNT in the control unit FCU transfers a measured result (count number) to the second control circuit PE2 in the control unit FCU.

(6) The second control circuit PE2 of the control unit FCU sets a voltage value corresponding to the count number, and sets it to the first register REG1 in the memory unit FMU.

For example, the second control circuit PE2 determines an erasure voltage to be applied next time to the main electrode of the memory cell transistor, based on the count number of the counter CNT.

(7) The above procedures (2) to (6) are executed until reaching a specified number of erasure times.

(8) An erasure verification operation is executed.

As illustrated in FIG. 3, in the charge pump circuit of the power source circuit PSC, if the voltage is greater than a predetermined voltage (for example V1), the supply current is reduced, and its pump capability is lowered. Hence, the second control circuit PE2 sets the relationship between the count number of the counter CNT and the voltage increase/decrease width, as follows.

(a) When the count number of the counter CNT is large, it is determined that the charge pump capability of the power source circuit PSC is insufficient. At this time, the erasure voltage is lowered, thereby performing the erasure with high capability. For example, the erasure voltage at this time is V1, whereas the voltage decrease width is $\Delta$Vd.

(b) If the erasure voltage remains low, the Vth variation hardly occurs (that is, Vth cannot deeply be formed). Thus, the erasure voltage is increased, when the count number of the counter CNT is small. The erasure voltage at this time is, for example, V2, whereas the voltage increase width is $\Delta$Vi. In this case, $\Delta$Vi is equal to or greater than $\Delta$Vd. As a result, it is possible to enhance the erasure voltage.

(c) The above procedures (a) and (b) are repeated.

Accordingly, the descriptions have been made to the erasure operation, and the same applies to the writing operation. At the writing operation, "erasure" is replaced by "write". When the erasure and the write are not distinguished, "rewrite" is used.

Conventionally, the actual machine evaluation is repeatedly performed for the set value of the application voltage at the time of rewriting, to obtain an optimum value. This value can correspond to the entire semiconductor chips, with a margin, instead of corresponding to each of the semiconductor chips. In this embodiment, the optimum set value (application voltage information) is calculated by the control unit FCU from the rewrite time (the count value of the counter CNT). As a result, it is possible to perform voltage application in accordance with the rewrite characteristic of each semiconductor chip, and the rewriting is performed based on the minimum voltage and time, thus contributing to the reliable improvement of the memory cells.

To determine the application voltage information (a voltage increment width) based on the rewrite time, it is possible to reduce the table scale. As a result, it is possible to reduce a memory region for storing the rewrite information in the memory unit FMU, reduce the number of registers in the control unit FCU, and reduce the transfer time for transferring the rewrite information.

Figure 4:
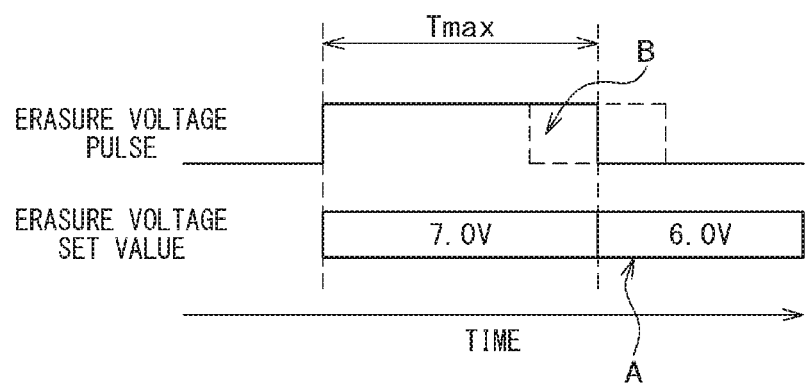
FIG. 4 is a diagram for explaining the maximum setting of an erasure time.

Descriptions will now be made to the maximum setting of the rewrite time (erasure time and rewrite time), using FIG. 4. FIG. 4 is a diagram for explaining the maximum setting of the erasure time.

After the maximum (Tmax) of the erasure time (count number of the counter CNT) is set, and before the erasure end flag is received, when the pulse application time of the erasure voltage exceeds the maximum (Tmax), the control unit FCU automatically decreases the erasure voltage to a predetermined voltage ("A" of FIG. 4, for example, between 7.0 V and 6.0 V). At this time, the measured erasure time (counter CNT) is reset, and the procedures from and after (2) are executed. When it is equal to or lower than the maximum of the erasure time (Tmax), the procedures from and after (4)

are executed (perform increasing of the voltage in accordance with the erasure time and perform pulse application of the next erasure voltage) ("B" of FIG. 4). The descriptions have been made to the maximum setting of the erasure time. However, the same applies to the maximum setting of the write time. Then, it is possible to apply the rewrite pulse with the optimum voltage and width, in accordance with the rewrite characteristic of each semiconductor chip, and to contribute to the reliable improvement of the memory cells.

The erasure voltage may be monitored, and the erasure verification may not be performed until the erasure voltage reaches a predetermined voltage. The write voltage may be monitored, and the write verification may not be performed until the write voltage reaches a predetermined voltage. As a result, unnecessary verification can be skipped, and the rewrite time can be reduced.

The preferred embodiment will hereinafter be described using the following example.

EMBODIMENT

[Configuration of Semiconductor Device]

FIG. 5 is a block diagram illustrating a configuration of a semiconductor device according to an embodiment. In FIG. 5, a microcomputer as an example of the semiconductor device includes, in one semiconductor chip, a CPU (Central Processing Unit) 2, a RAM (Random Access Memory) 3, a non-volatile memory unit 4, a peripheral circuit 5, an interface circuit (I/F) 7, a data bus 8 which mutually couples them, and a power source circuit 6.

The power source circuit 6 generates an internal power source voltage (VDD) based on an external power source voltage (VCC) from the outside of the microcomputer 1. The internal power source voltage (VDD) is supplied to each unit of the microcomputer 1 (FIG. 5 representatively illustrates the supply only to the non-volatile memory unit 4).

The non-volatile memory unit 4 is an EEPROM (Electrically Erasable and Programmable Read-only Memory) or a flash memory. Each memory cell of the non-volatile memory unit 4 has a charge accumulation unit between the gate electrode and the channel layer. The threshold voltage of the memory cell is changed by the charges accumulated in the charge accumulation unit, thereby enabling to store information "1" or "0". Generally, a floating gate formed of a polycrystalline silicon film or a silicon nitride film is used for the charge accumulation unit. The silicon nitride film accumulates charges by trap levels dispersed in the film. In this embodiment, descriptions will now be made to an example in which the silicon nitride film is used as the charge accumulation unit. A specific configuration of the memory cell will now more specifically be described.

[Configuration of Memory Cell]

Figure 6A:
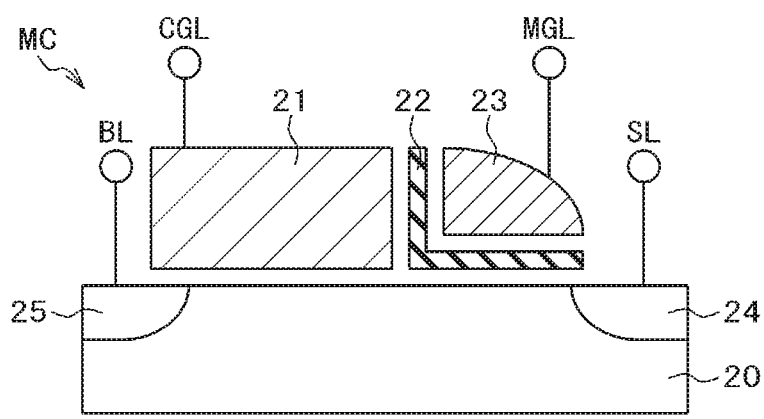
FIG. 6A is a cross sectional view schematically showing a configuration of a memory cell.
Figure 6B:
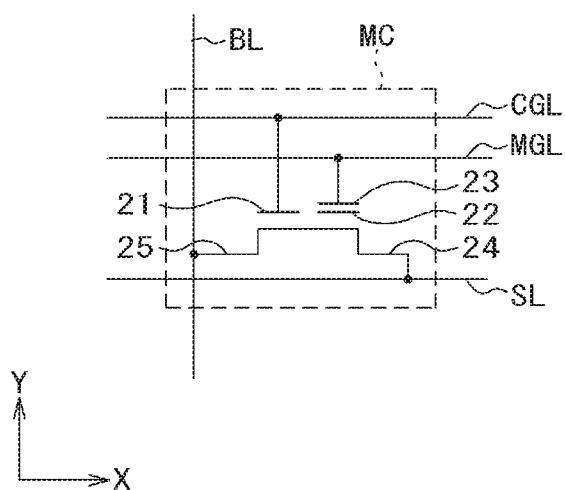
FIG. 6B is a diagram illustrating circuit diagram symbols of the memory cell.

FIG. 6A is a cross sectional view schematically showing a configuration of a memory cell. FIG. 6B is a diagram illustrating circuit diagram symbols of the memory cell. In FIG. 6A and FIG. 6B, corresponding parts are identified by the same reference symbols.

By reference to FIG. 6A and FIG. 6B, a memory cell (also referred to as a "memory cell transistor") MC is formed on a substrate 20, and includes a control gate (CG) 21, a charge accumulation unit 22, a memory gate (MG) 23, a source region 24, and a drain region 25. The control gate 21 is formed on the surface of the P-type silicon substrate 20 through an insulating layer (not illustrated). The charge accumulation unit 22 is formed of an ONO (Oxide-Nitride-Oxide) film on the sidewall of the control gate 21. This ONO film is formed of a silicon oxide film (not illustrated), a silicon nitride film (not illustrated), and a silicon oxide film (not illustrated). The memory gate 23 having a sidewall structure is formed on the ONO film. The source region 24 and the drain region 25 are formed by injecting N-type impurities respectively on the left side of the control gate 21 and the right side of the memory gate 23. As seen from the direction vertical to the substrate 20, a part of the memory gate 23 overlaps a part of the source region 24, while a part of the control gate 21 overlaps a part of the drain region 25.

In the memory array in which a plurality of memory cells MC are arrayed, memory gate lines MGL, control gate lines CGL, and source lines SL are provided and extend in the row direction X corresponding to the memory cell row. A main bit line BL is provided and extend in the column direction Y corresponding to the memory cell column. In each memory cell MC, the memory gate 23 is connected to a corresponding memory gate line MGL. The control gate 21 is connected to a corresponding control gate line CGL. The source region 24 is connected to a corresponding source line SL. The drain region 25 is connected to a corresponding main bit line BL.

[Operation of Memory Cell]

A unique address is allocated to each memory cell MC, and each memory cell MC stores one bit data in accordance with a change of the threshold voltage corresponding to the charge amount of the charge accumulation unit 22.

Figure 7A:
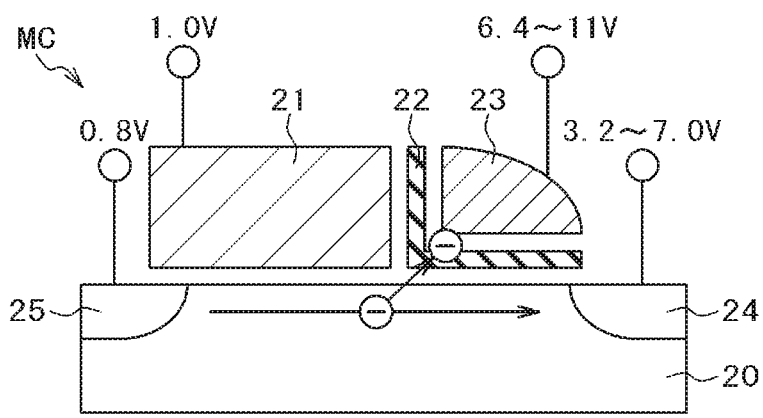
FIG. 7A is a diagram illustrating a state at the time of a program pulse application operation.
Figure 7B:
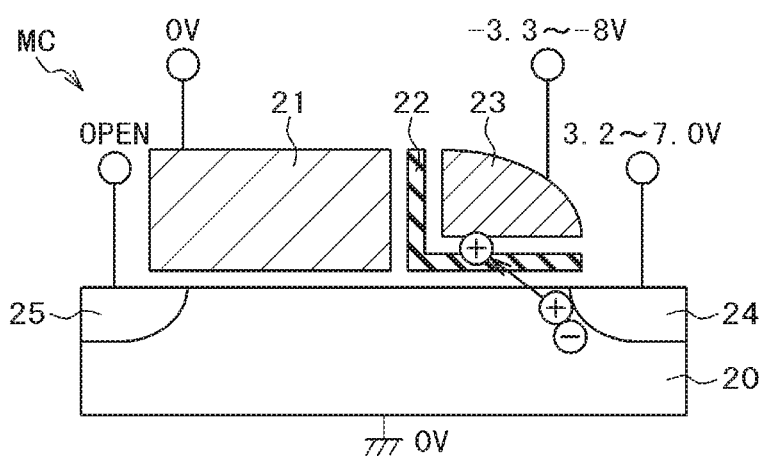
FIG. 7B is a diagram illustrating a state at the time of an erasure pulse application operation.
Figure 7C:
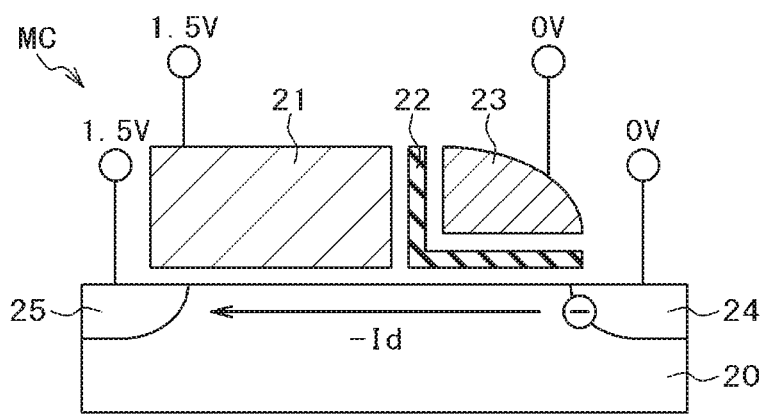
FIG. 7C is a diagram illustrating a state at the time of a reading operation.
Figure 7D:
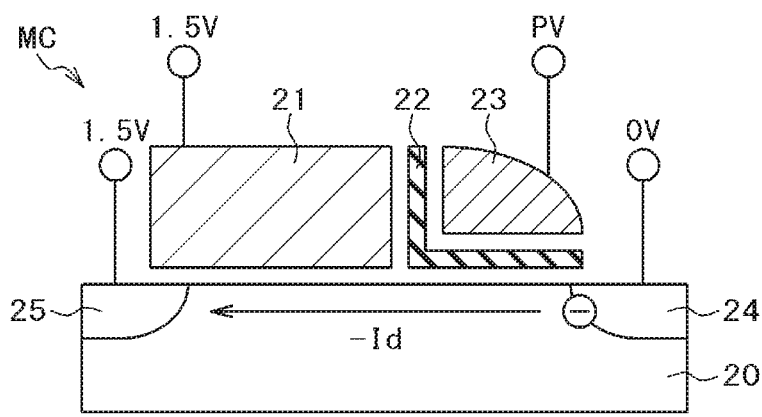
FIG. 7D is a diagram illustrating a state at the time of a program verification operation.

Each of FIG. 7A to FIG. 7D illustrates a state at the operation of the memory cell MC. FIG. 7A is a diagram illustrating a state at the time of a program pulse application operation. FIG. 7B is a diagram illustrating a state at the time of an erasure pulse application operation. FIG. 7C is a diagram illustrating a state at the time of a reading operation. FIG. 7D is a diagram illustrating a state at the time of a program verification operation.

By reference to FIG. 7A, at the time of the program pulse application operation, a voltage selected between 6.4 to 11 V is applied to the memory gate 23, a voltage of 1.0 V is applied to the control gate 21, a voltage selected between 3.2 to 7.0 V is applied to the source region 24, and a voltage of 0.8 V is applied to the drain region 25. Then, hot electrons are injected to the charge accumulation unit 22 using an SSI (Source Side Injection) technique, resulting in increasing the threshold voltage of the memory cell MC. The program pulse application operation is performed over and over until the threshold voltage of the memory cell MC is greater than a predetermined program verification voltage (PV). The programmed memory cell MC stores, for example, "1", of data "0" and "1" (it may be "0", but "1" is stored in this specification). The voltage of the memory gate 23 is set to a high level on the positive side, when the threshold voltage of the memory cell MC is hardly high. The voltage of the source region 24 is set in accordance with the voltage of the memory gate 23.

By reference to FIG. 7B, at the time of the erasure pulse application operation, a voltage selected between −3.3 to −8 V is applied to the memory gate 23, a voltage of 0 V is applied to the control gate 21, a voltage of 3.2 to 7.0 V is applied to the source region 24, the drain region 25 is in an OPEN state, and the substrate 20 is grounded (0 V is applied). Thus, a high electric field is applied to a part of the source region 24 which overlaps the memory gate 23. Because an energy band is bent, it causes occurrence of BTBT (Band To Band Tunneling) in which electrons are tunneled from the valance band to the conduction band. Due to the BTBT, holes are generated in the valance band. The tunneled electros reach the source line SL, and a part of the holes generated in the valance band reaches the substrate 20.

This causes a current to flow from the source line SL to the substrate 20. A part of the generated holes are accelerated by the high electric field, thereby being injected to the charge accumulation unit 22 as hot holes. This results in decreasing the threshold voltage of the memory cell MC.

The application operation of the erasure pulse is executed using the BTBT technique over and over, until the threshold voltage of the memory cell MC becomes lower than a predetermined erasure verification voltage (EV). The memory cell MC after the erasure stores, for example, "0", of data "0" and "1". Note that the voltage of the memory gate 23 is set to a high level on the negative side, when the threshold voltage of the memory cell MC is hardly low. The voltage of the source region 24 is set in accordance with the voltage of the memory gate 23.

By reference to FIG. 7C, at the time of a reading operation, 0 V is applied to the memory gate 23 and the source region 24, 1.5 V is applied to the control gate 21 and the drain region 25, and a determination is made as to whether a read current (Id) flowing between the drain region 25 and the source region 24 is greater than a threshold current. When the read current (Id) is greater than the threshold current, it is determined that the storage data of the memory cell MC is "0", because the threshold voltage of the memory cell MC is low. On the contrary, when the read current (Id) is lower than the threshold current, it is determined that the storage data of the memory cell MC is "1", because the threshold voltage of the memory cell MC is high.

By reference to FIG. 7D, at the time of a program verification operation, a program verification voltage (PV) is applied to the memory gate 23, 0 V is applied to the source region 24, 1.5 V is applied to the control gate 21 and the drain region 25, and a determination is made as to whether a read current (Id) flowing between the drain region 25 and the source region 24 is greater than a threshold current. When the read current (Id) is greater than the threshold current, it is determined that the program has not been completed, because the threshold voltage of the memory cell MC is lower than the program verification voltage (PV). On the contrary, when the read current (Id) is lower than the threshold current, it is determined that the program has been completed, because the threshold voltage of the memory cell MC is greater than the program verification voltage (PV).

At the time of an erasure verification operation, in FIG. 7D, an erasure verification voltage (EV) is applied to the memory gate 23, instead of the program verification voltage (PV). The voltage to be applied to another position is the same as the case of FIG. 7D. When the read current (Id) flowing between the drain region 25 and the source region 24 is greater than a threshold current, it is determined that the erasure has been completed, because the threshold voltage of the memory cell MC is lower than the erasure verification voltage (EV). On the contrary, when the read current (Id) is lower than the threshold current, it is determined that the erasure has not been completed, because the threshold voltage of the memory cell MC is greater than the erasure verification voltage (EV).

[Configuration of Non-volatile Memory Unit]

Figure 8:
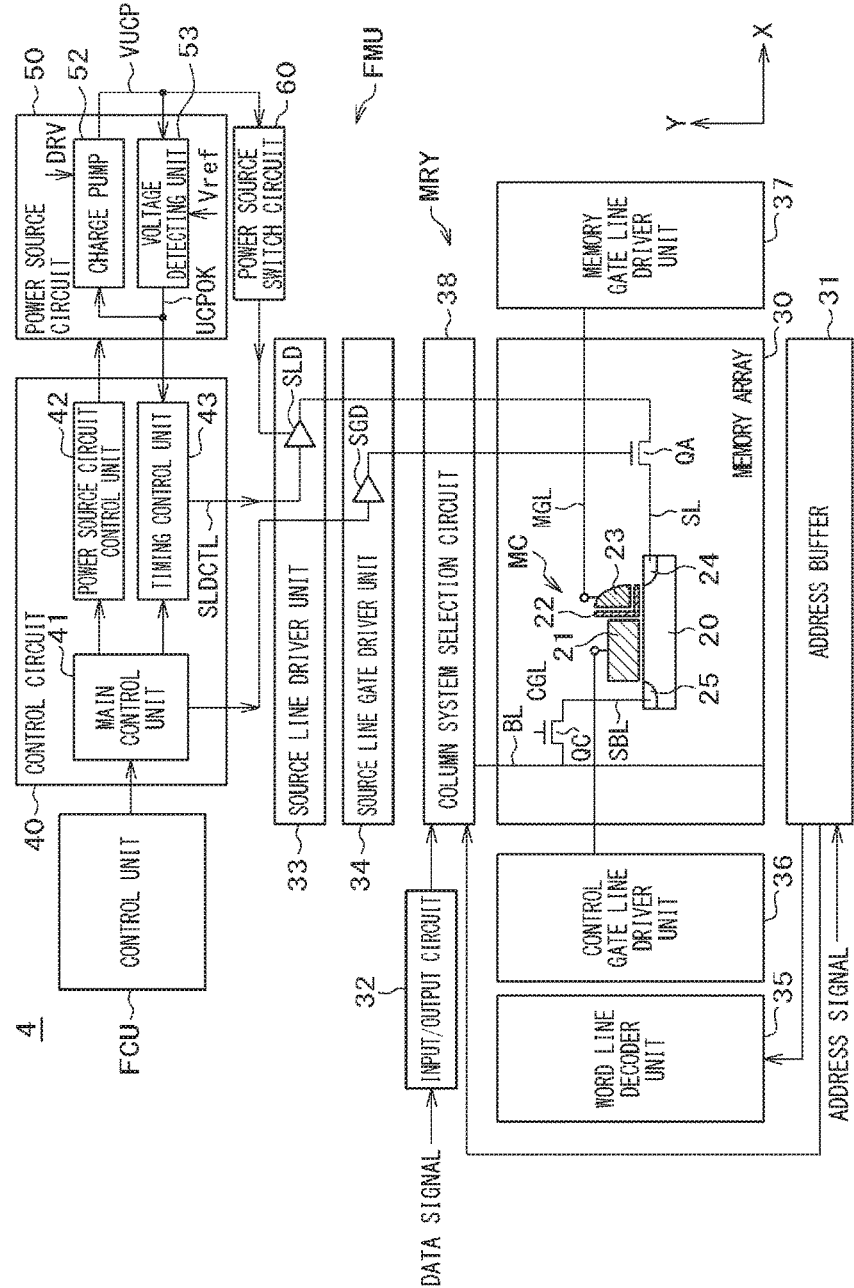
FIG. 8 is a block diagram illustrating the entire configuration of a non-volatile memory unit of FIG. 5.

FIG. 8 is a block diagram illustrating the entire configuration of the non-volatile memory unit of FIG. 5. The non-volatile memory unit 4 includes the memory unit FMU and the control unit FCU. The memory unit FMU includes the memory MRY, a control circuit 40 (PE1) having the first register REG1 (not illustrated), a power source circuit 50 (PSC), and a power source switch circuit 60. The memory MRY stores initial setting information (table) which is necessary for the rewriting, such as the erasure. The memory MRY includes a memory array 30, an address buffer 31, an input/output circuit 32, a word line decoder unit 35, a control gate line driver unit 36, a memory gate line driver unit 37, a column system selection circuit 38, a source line driver unit 33, and a source line gate driver unit 34. As described above, the control unit FCU includes the second control circuit PE2 (not illustrated) having an erasure start flag, the second register REG2 (not illustrated), and the counter CNT (not illustrated) measuring the erasure voltage application time, and performs the above operation.

In the memory array 30, a plurality of memory cells MC, described in FIG. 6A and FIG. 6B, are arranged in matrix. In this embodiment, the bit lines include a plurality of main bit lines BL and sub bit lines SBL. To each of the main bit lines BL, the plurality of sub bit lines SBL are connected through a transistor QC for switch. The drain region 25 of the memory cell MC is connected to its corresponding sub bit line SBL.

The address buffer 31 receives address signals (row address signals and column address signals) from the external (for example, the CPU 2 of FIG. 5) of the non-volatile memory unit 4. The address buffer 31 outputs the externally received row address signal to the word line decoder unit 35, and outputs the column address signal to the column system selection circuit 38.

The input/output circuit 32 outputs a write data signal received from the external (for example, the CPU 2 of FIG. 5) of the non-volatile memory unit 4, to the column system selection circuit 38. The input/output circuit 32 further outputs a read data signal received from the column system selection circuit 38 to the external of the non-volatile memory unit 4.

The word line decoder unit 35 outputs a signal specifying a selection row of the memory array 30, by decoding the row address signal received through the address buffer 31.

The control gate line driver unit 36 supplies a predetermined operational voltage received through the power source switch circuit 60 to the control gate line CGL corresponding to the selection row specified by the word line decoder unit 35.

The memory gate line driver unit 37 supplies a predetermined operational voltage received through the power source switch circuit 60 to the memory gate line MGL corresponding to the selection row specified by the word line decoder unit 35.

The source line driver unit 33 includes a plurality of source line drivers SLD. Each of the source line drivers SLD supplies a ground voltage or the predetermined operational voltage received through the power source switch circuit 60, to the corresponding source line SL. Each of the source line drivers SLD is connected to the source line SL via a corresponding transistor QA for switch.

The source line gate driver unit 34 includes a plurality of source line gate drivers SGD. Each of the source line gate driver units 34 drives the gate of a corresponding transistor QA.

In the column system selection circuit 38, a plurality of write latches in one-to-one correspondence with the main bit lines BL. Each of the write latches stores write data input via the input/output circuit 32.

In the column system selection circuit 38, further, there is provided a column decoder circuit which decodes the column address signal received via the address buffer 31. At the time of data writing, the column system selection circuit 38 supplies the ground voltage or the predetermined operational voltage received via the power source switch circuit 60 to the selected main bit line BL (the main bit line BL corresponding to the selected column), based on a decoded result by the column decoder circuit and the write data stored in the write latch.

The column system selection circuit 38 further includes a reading sense amplifier (SA) circuit and a verification sense amplifier circuit. The reading sense amplifier detects a current flowing through a target memory cell MC to be read via the selected main bit line BL. The verification sense amplifier circuit detects a current flowing through a target memory cell MC to be programmed or to be erased via the selected main bit line BL.

The control circuit 40 corresponds to the first control circuit PE1 of FIG. 1, and controls the memory MRY in accordance with a control signal from the second control circuit PE2 executing various operational modes, such as a program pulse application operation, an erasure pulse application operation, a reading operation, a program verification operation, and an erasure verification operation, in accordance with a command received from the host, such as the CPU 2 of FIG. 5. The control circuit 40 further controls the power source circuit 50 and the power source switch circuit 60, to supply an operational voltage necessary for each of the various operational modes to each driver unit. At the time of the memory rewriting, the control unit FCU reads data of the table in the memory MRY, and writes it back to the first register REG1 in the control circuit 40.

More specifically, the control circuit 40 includes a main control unit 41 receiving a control signal from the control unit FCU, a power source circuit control unit 42, and a timing control unit 43. The power source circuit control unit 42 controls the power source circuit 50 under the control of the main control unit 41. The timing control unit 43 outputs a control signal (SLDCTL) to the source line driver unit 33 under the control of the main control unit 41, thereby controlling the timing of supplying an operational voltage (a boosted voltage (VUCP)) to each of the source lines SL. In this specification, the control signal (SLDCTL) to be output to the source line driver unit 33 at the time of the erasure operation is referred to also as an "erasure pulse".

Though not illustrated in FIG. 8, the timing control unit 43 further outputs a control signal to the memory gate line driver unit 37, thereby controlling the timing of supplying the operational voltage to each of the memory gate lines MGL. In addition, it outputs a control signal to the control gate line driver unit 36, thereby controlling the timing of supplying the operational voltage to each of the control gate lines CGL.

The power source circuit 50 includes a charge pump circuit which generates operational voltages with various magnitudes in accordance with each operational mode, by boosting an internal power source voltage (VDD) generated by the power source circuit 6 of FIG. 5 in a positive direction or in a negative direction.

For example, the power source circuit 50 includes a charge pump circuit 52 and a voltage detection unit 53 illustrated in FIG. 8, as constituent elements for generating a boosted voltage (VUCP) to be supplied to the source line at the time of the erasure pulse application operation. The power source circuit 50 includes a plurality of same circuit configurations for generating the operational voltages with various magnitudes in accordance with each operational mode.

The charge pump circuit 52 as a voltage generation circuit generates a boosted voltage (VUCP) which has been obtained by boosting the internal power source voltage (VDD), based on a drive signal (clock) (DRV) from a ring oscillator (not illustrated).

The voltage detection unit 53 detects an output voltage (a boosted voltage (VUCP)) of the charge pump circuit 52, and compares the voltage obtained by dividing the boosted voltage (VUCP) and a reference voltage (Vref) generated by a reference voltage oscillation circuit (not illustrated). The voltage detection unit 53 controls a control signal (UCPOK) to be in an activated state, when the voltage obtained by dividing the boosted voltage (VUCP) is equal to or greater than the reference voltage (Vref). The charge pump circuit 52 stops a boosting operation, when the control signal (UCPOK) in an activated state is received from the voltage detection unit 53. The control signal (UCPOK) is input to the timing control unit 43. As will specifically be explained in FIG. 10 and FIG. 11, the timing control unit 43 controls the timing for the control signal (SLDCTL) to be output to the source line driver SLD, based on the control signal (UCPOK).

The power source switch circuit 60 is a switch group (also referred to as a distributor), which receives the operational voltages with various magnitudes generated by the power source circuit 50, and switches the magnitude or a supply target of the operational voltage to be supplied in accordance with each operational mode.

The memory array 30 is formed of the memory cells MC of FIG. 6A and FIG. 6B, in 64 rows and 4096 columns, as one example. The memory array 30 is divided into 32 memory blocks each of which is formed of the memory cells MC in 16 rows and 512 columns. Thus, in the memory array 30, the 32 memory blocks are arranged in 4 rows and 8 columns. In each memory block, the source lines SL are mutually connected and shared.

The source line driver unit 33 includes the source line driver SLD driving the source lines of the memory block. There are provided 32 NMOS (Negative-channel Metal Oxide Semiconductor) transistors QA for switches, respectively corresponding to the source line drivers SLD. The operational voltage output from each of the source line drivers SLD is supplied to the common source line SL provided to the corresponding memory blocks, through the corresponding NMOS transistor QA. The NMOS transistor QA is switched ON or OFF in accordance with the signal output from the source line gate driver SGD. Though not illustrated in FIG. 8, the 32 source line drivers SLD and the 32 NMOS transistors QA are provided.

[Change In Output Voltage of Charge Pump Circuit At Erasure Operation]

Descriptions will now be made to an erasure operation in the non-volatile memory unit 4 of the embodiment.

Figure 9:
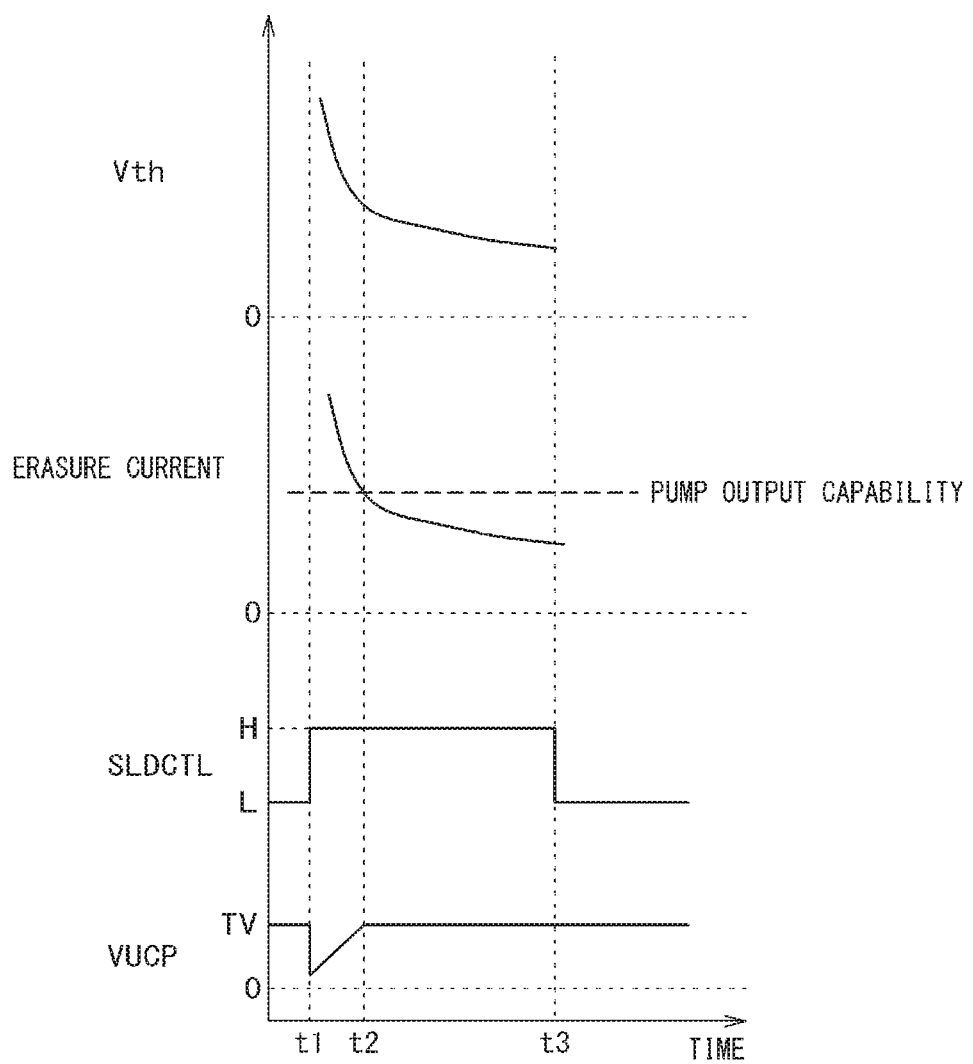
FIG. 9 is a diagram for explaining a change of an output current and an output voltage of the charge pump circuit at the time of an erasure operation.

FIG. 9 is a diagram for explaining a change in each of an output current and an output voltage of the charge pump circuit at the time of the erasure operation. FIG. 9 illustrates waveforms of a threshold voltage (Vth) of the memory cell, an output current (an erasure current) of the charge pump circuit, a control signal (an erasure pulse) (SLDCTL) output from the timing control circuit 43 of the control circuit 40 of FIG. 8, and an output voltage (VUCP) of the charge pump circuit 52 of FIG. 8, in the order from the above.

By reference to FIG. 8 and FIG. 9, in a period from a first time (t1) to a third time (t3) of FIG. 9, the control signal (SLDCTL) to be supplied to the source line driver SLD is in an activated state (in the case of the embodiment, H (High) level). In this period, a positive high voltage (VUCP) is applied to the source region 24 of the memory cell MC. At this time, because a negative high voltage is applied to the memory gate MG, pairs of electrons and holes are generated by the band-to-band tunneling, in a part overlapping the memory gate 23 of the source region 24. The generated electrons reach the source line SL, and a part of the generated holes reach the substrate 20. The other part of the generated holes are injected to the charge accumulation unit 22 in the form of hot holes, by being accelerated by the high electric field. By this injection of the hot holes, the threshold voltage (Vth) of the memory cell MC is decreased. As the hot holes inject to the charge accumulation unit 22 more and more, the electric field applied to the source region 24 is reduced. Thus, the erasure current is gradually reduced and then saturated.

The charge pump circuit 52 operates to maintain the output voltage (VUCP) at a target voltage (TV) by feedback control. However, during the first period (a period from the first time (t1) to the second time (t2) of FIG. 9) in the erasure pulse application time (from the first time (t1) to the third time (t3)), a relatively large erasure current flows, thus causing the erasure current to exceed the output performance of the charge pump circuit. As a result, the output voltage (VUCP) is temporarily lower than the target voltage (TV). If the erasure current is reduced with the lapse of time, and if the erasure current is in a short time equal to or lower than the output performance of the charge pump circuit, the output voltage (VUCP) of the charge pump circuit 52 is recovered to the target voltage (TV).

The threshold voltage (Vth) is remarkably decreased due to the injection of the hot holes to the charge accumulation unit 22, in the initial time (from the first time (t1) to the second time (t2)) of the application period of the erasure pulse. Thus, in a period in which a relatively large erasure current flows (a period in which an erasure current flows relatively larger than that in the period in which the erasure current is saturated), if the erasure pulse is intensively applied, it is possible to effectively decrease the threshold voltage (Vth) in a short erasure time.

Figure 10:
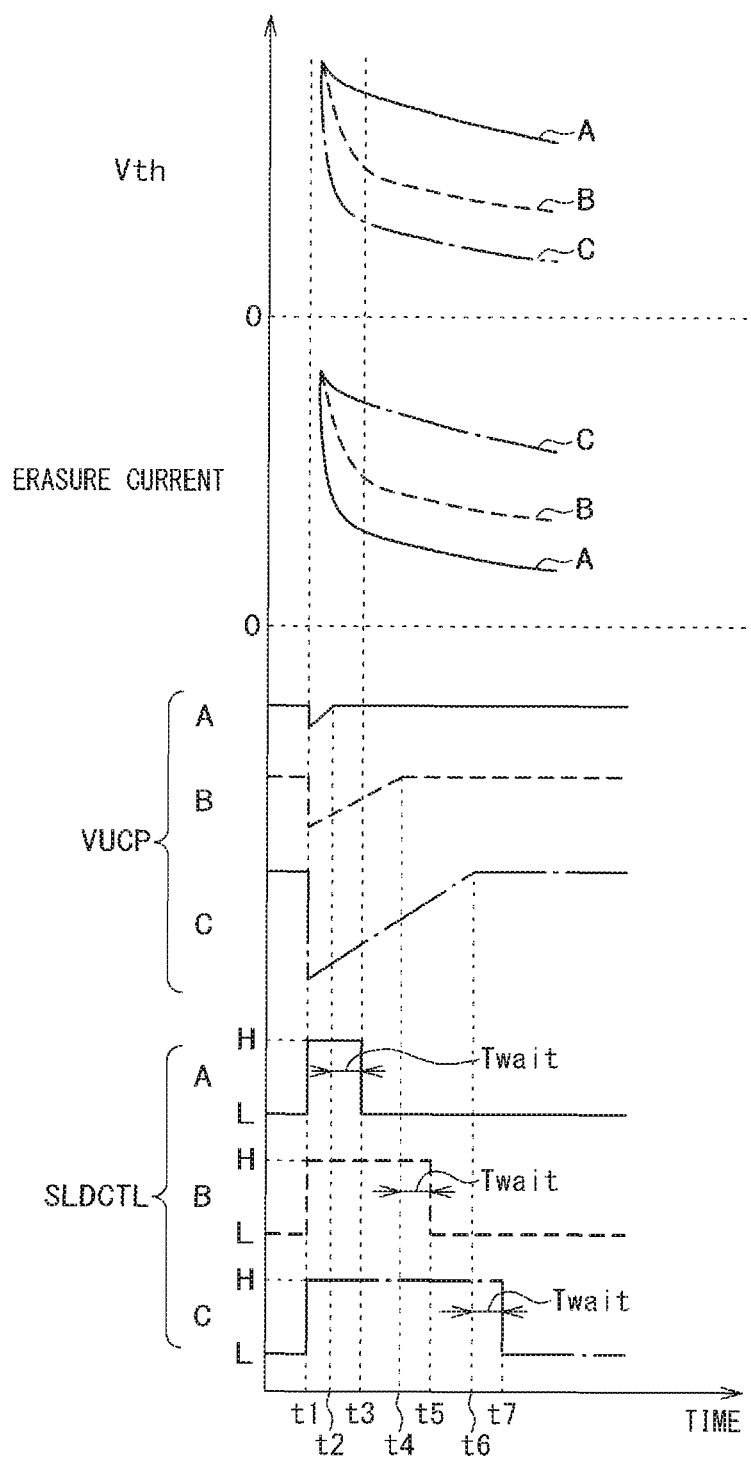
FIG. 10 is a diagram for explaining an appropriate method of setting an application time for an erasure pulse.

FIG. 10 is a diagram for explaining an appropriate method of setting an application time for an erasure pulse.

FIG. 10 illustrates a case (A) in which the erasure current is relatively small and the threshold value (Vth) is slightly decreased, a case (C) in which the erasure current is relatively large and the threshold voltage (Vth) is largely decreased, and a case (B) in the middle therebetween. When the erasure current is relatively small (A), the output voltage (VUCP) of the charge pump circuit 52 is temporarily decreased in a relatively short period (from the first time (t1) to the second time (t2) of FIG. 10). When the erasure current is relatively large (C), the output voltage (VUCP) is temporarily decreased in a relatively long period (from the first time (t1) to the sixth time (t6) of FIG. 10). When the erasure current in the middle therebetween flows (B), the output voltage (VUCP) is temporarily decreased in a period (from the first time (t1) to the fourth time (t4) of FIG. 10) in the middle of the cases (A) and (C).

Thus, it is possible to optimize the application time of the erasure pulse based on the period in which the output voltage (VUCP) of the charge pump circuit 52 is temporarily decreased. Specifically, when a predetermined wait time (Twait) has elapsed since the output voltage (VUCP) of the charge pump circuit 52 is recovered, a control signal (SLDCTL) of the source line driver SLD is returned to an inactivated state (in the case of the embodiment, L (Low) level), and application of the erasure pulse is completed. For example, when the middle erasure current flows (B), the control signal (SLDCTL) is activated in a period from the first time (t1) to the fifth time (t5). When the relatively large erasure current flows (C), the control signal (SLDCTL) is activated in a period from the first time to the seventh time (t7). The wait time (Twait) is set in advance in consideration of the reduction of the erasure time, but it may be 0.

[Specific Erasure Operation]

Figure 11:
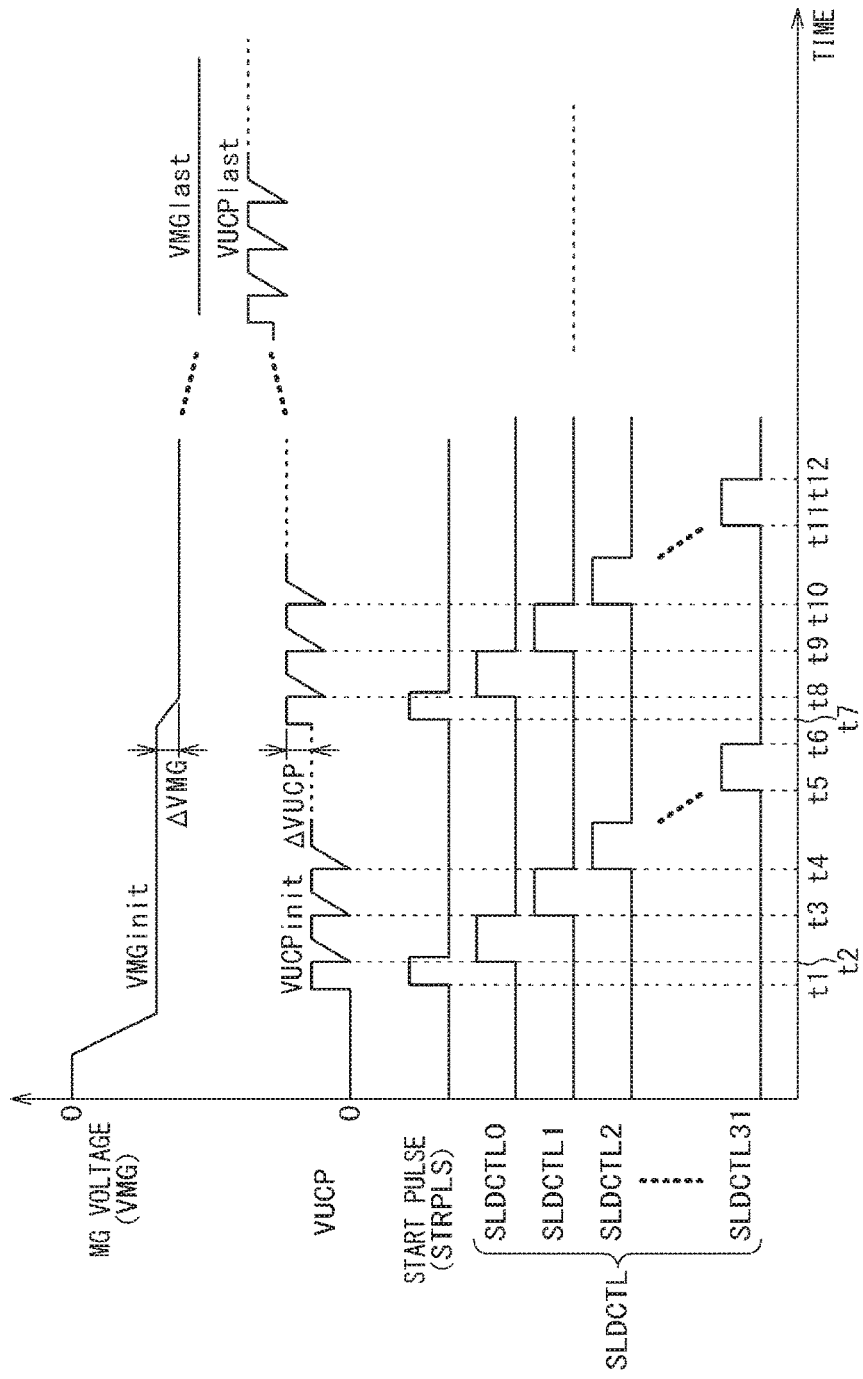
FIG. 11 is a diagram for explaining an erasure operation in the non-volatile memory unit of FIG. 8.

FIG. 11 is a diagram for explaining the erasure operation in the non-volatile memory unit illustrated in FIG. 8. FIG. 11 illustrates waveforms of a voltage (a memory gate voltage (VMG)) to be applied to the memory gate MG of each memory cell MC of the memory array 30, an output voltage (VUCP) of the charge pump circuit 52, a start pulse signal (STRPLS), and control signals (erasure pulses) (SLDCTL0 to SLDCTL31) to be supplied respectively to 32 source line drivers SLD0 to SLD31 (see FIG. 12), in the order from the above.

Like the erasure method using the band-to-band tunneling, when the current flowing through the memory cell at the time of erasure operation is relatively large, the number of memory cells simultaneously performing the erasure is restricted, due to the limit of the current supply capability of the charge pump circuit. Thus, in the non-volatile memory unit 4 of FIG. 8, a high voltage (a boosted voltage (VUCP)) is applied to the source line in the unit of each memory block.

By reference to FIG. 11, at the time of the erasure operation, the memory gate voltage (VMG) and the output voltage (VUCP) of the charge pump circuit 52 are set to an initial value (VMGinit) and an initial value (VUCPinit), based on the contents of the first register REG1 storing information of the table. Let it be assumed that the transistor QA of FIG. 8 is in an ON state.

In the next first time (t1), the main control unit 41 of FIG. 8 outputs a start pulse signal (STRPLS) to the timing control unit 43. After the start pulse signal (STRPLS) is changed to an activated state (in the case of the embodiment, H level), the timing control unit 43 controls a control signal (SLDCTL0), to be supplied to the source line driver SLD0, to be in an activated state (in the case of the embodiment, H level), in the second time (t2). Then, the output voltage (VUCP) of the charge pump circuit 52 is applied to the source line of the first memory block. Because the current supply capability of the charge pump circuit 52 is limited, the output voltage (VUCP) is temporarily decreased. (In this case, it is necessary that the transistor QA of FIG. 8 is ON)

If the output voltage (VUCP) of the charge pump circuit 52 is recovered to the target voltage (for example, the initial value (VUCPinit)), the voltage detection unit 53 of FIG. 8 controls a control signal (UCPOK) to be in an activated state. After the control signal (UCPOK) is activated, the timing control unit 43 controls the control signal (SLDCTL0), to be supplied to the source line driver SLD0 in the third time (t3), to be in an inactivated state (in the case of the embodiment, L level), and controls the control signal (SLDCTL1), to be supplied to the source driver SLD1, to be in an activated state (H level). As a result, the application of the boosted voltage (VUCP) to the source line of the first memory block is completed, and the application of the boosted voltage (VUCP) to the source line of the second memory block is started.

As a result that the output voltage (VUCP) of the charge pump circuit 52 is recovered to the target voltage (the initial value (VUCPinit)), after the control signal (UCPOK) is activated, the timing control unit 43 controls the control signal (SLDCTL1) to be inactivated in the fourth time (t4), and controls the control signal (SLDCTL2) to be supplied to a source line driver SLD2 to be activated.

By the same control below, the timing control unit 43 of FIG. 8 controls control signals (SLDCTL3 to SLDCTL31) to be supplied respectively to the source line drivers SLD3 to SLD31, to be activated sequentially in this order. That is, when to activate an "i+first" (1≤I≤30) control signal (SLD-CTLi), the timing control unit 43 controls an "i-th" control signal (SLDCTLi-1) to be inactivated. The last control signal (SLDCTL31) is returned into an inactivated state in the sixth time (t6) of FIG. 11. In this specification, the period from the first time (t1) to the sixth time (t6) is called "one cycle".

At the point the erasure operation of one cycle is completed, the set value of the memory gate voltage (VMG) is decreased by a predetermined voltage width (ΔVMG) based on the contents of the first register REG1, and the set value of the output voltage (VUCP) of the charge pump circuit 52 is increased by a predetermined voltage width (ΔVUCP). As a result, a high voltage is applied between the source region 24 and the memory gate 23 of the memory cell MC.

In a period from the next seventh time (t7) to the time (t12), the erasure operation of the same one cycle as that of the first time (t1) to the sixth time (t6) is executed, with the set values of a new memory gate voltage (VMG) and an output voltage (VUCP) of the charge pump circuit 52 based on the contents of the first register REG1. That is, an operation for further decreasing the threshold voltage of the memory cell MC is executed at a new high voltage. The memory cell, in which the erasure current is once saturated in a period from the first time (t1) to the sixth time (t6), shows again the characteristic of the erasure current illustrated in FIG. 9, at a new high voltage.

Every time the erasure operation of one cycle is completed, the set value of the memory gate voltage (VMG) is decreased by a predetermined voltage width (ΔVMG) based on the contents of the first register REG1, and the set value of the output voltage (VUCP) of the charge pump circuit 52 is increased by a predetermined voltage width (ΔVUCP). As a result, a high voltage is applied between the source region 24 and the memory gate 23 of the memory cell MC, as the cycle progresses.

For example, after the erasure operations of several cycles are completed, and the set value of the memory gate voltage (VMG) is decreased to some extent, the erasure verification operation is executed every time the erasure operation of one cycle is completed. Needless to say, the erasure verification operation may be executed, at every completion of the erasure operation of every one cycle from the beginning. The erasure is completed, when it is acknowledged that the threshold voltage of each memory cell MC is lower than the erasure verification voltage.

[About Control Signal Between Control Circuit and Power Source Circuit]

Figure 12:
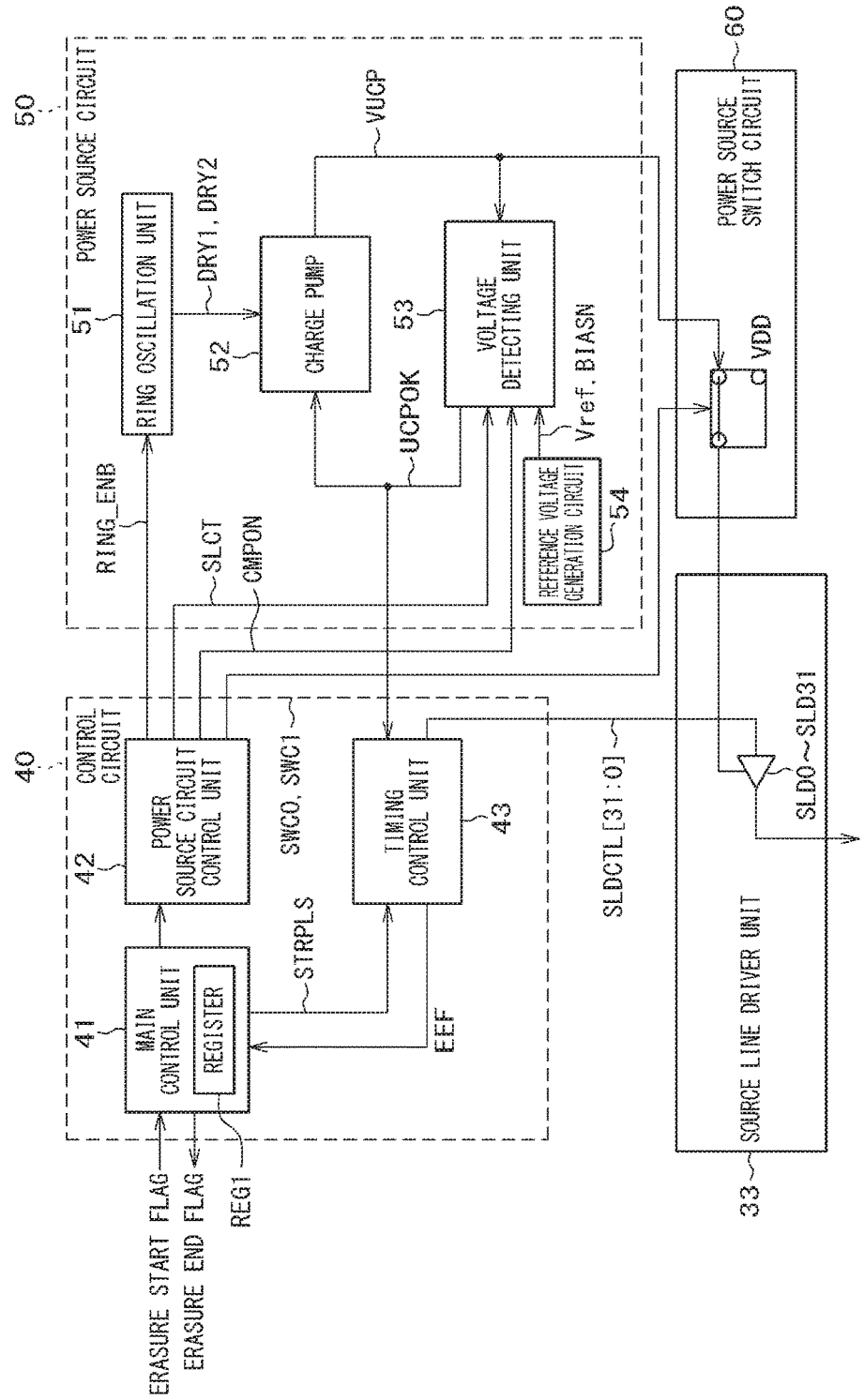
FIG. 12 is a diagram for explaining a control signal flowing between a control circuit and a power source circuit in the non-volatile memory unit of FIG. 8.

FIG. 12 is a diagram for explaining a control signal flowing between the control circuit and the power source circuit in the non-volatile memory unit of FIG. 8. By reference to FIG. 12, the control circuit 40 includes the main control unit 41, the power source circuit control unit 42, and the timing control unit 43. The power source circuit 50 includes the ring oscillation unit 51, the charge pump circuit 52, the voltage detection unit 53, and the reference voltage oscillation circuit 54.

The main control unit 41 includes the first register REG1, and outputs a start pulse signal (STRPLS) to the timing control unit 43, in response to input of an erasure start flag. The first register REG1 stores a set value of the erasure voltage, and the power source circuit control unit 42 generates a selection signal (SLCT), as will be described later, based on the erasure voltage set in the first register REG1.

The power source circuit control unit 42 outputs an enable signal (RING_ENG) for enabling an oscillation operation of the ring oscillation unit 51 to the ring oscillation unit 51, under the control of the main control unit 41. The power source circuit control unit 42 outputs an operation signal (CMPON) for enabling to operate the comparator and a selection signal (SLCT) for selecting a dividing ratio of a voltage divider, to the voltage detection unit 53. The power source circuit control unit 42 further outputs control signals (SWC0, SWC1) for controlling the switch to the power source switch circuit 60.

The ring oscillation unit 51 outputs drive signals (DRV1, DRV2) to the charge pump circuit 52. The drive signals (DRV1, DRV2) are clock signals whose phases are different from each other by 180 degrees.

The reference voltage generation circuit 54 generates a reference voltage (Vref) for use in comparing with the voltage obtained by dividing the output voltage (VUCP) of the charge pump circuit 52 and a bias voltage (BIASN) to be supplied to the MOS (Metal Oxide Semiconductor) transistor for the constant current source. The reference voltage generation circuit 54 outputs the generated reference voltage (Vref) and the bias voltage (BIASN) to the voltage detection unit 53.

When the divided voltage of the output voltage (VUCP) is equal to or greater than the reference voltage (Vref), the voltage detection unit 53 controls a control signal (UCPOK) to be in an activated state (in the case of the embodiment, H level). The control signal (UCPOK) is output to the charge pump circuit 52 and the timing control unit 43.

[Configuration Example of Charge Pump Circuit]

Figure 13:
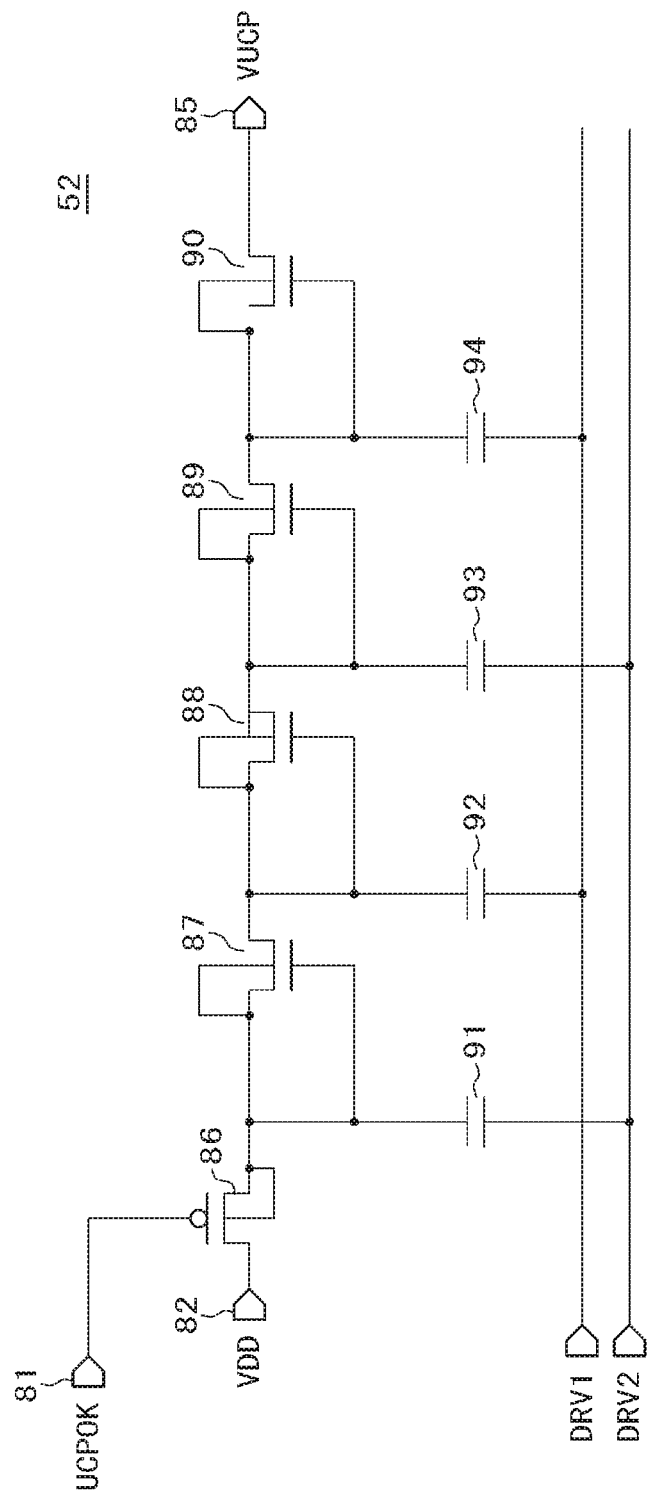
FIG. 13 is a circuitry diagram illustrating an example of a configuration of a charge pump circuit of FIG. 12.

FIG. 13 is a circuit diagram illustrating a configuration example of the charge pump circuit of FIG. 12.

By reference to FIG. 13, the charge pump circuit 52 includes an input node 82 to which a power source voltage (VDD) is input, a PMOS (Positive-channel MOS) transistor 86 and NMOS (Negative-channel MOS) transistors 87 to 90 which are connected in series with an output node 85 outputting a boosted voltage (VUCP), and capacitors 91 to 94.

The PMOS transistor 86 receives a control signal (UCPOK) at its gate. The PMOS transistor 86 is switched OFF, when the control signal (UCPOK) is turned into an activated state (in the case of the embodiment, H level). As a result, the oscillation operation of the charge pump circuit 52 stops. That is to say, activation of the control signal (UCPOK) substantially instructs inactivation of the charge pump circuit.

The NMOS transistors 87 to 90 are so-called diode-connected transistors in which the drain and the gate are connected. To the drain of each of the NMOS transistors 87 to 90, one end of the capacitors 91 to 94 is connected.

To the other end of the capacitors 91 and 93, a drive signal (DRV1) is supplied. To the other end of the capacitors 92 and 94, a drive signal (DRV2) is supplied. As a result, the NMOS transistors 87 to 90 are alternately turned ON, and they function as charge transfer switches for transferring positive charges in a direction from the input node 82 to the output node 85.

[Configuration Example of Voltage Detection Unit]

Figure 14:
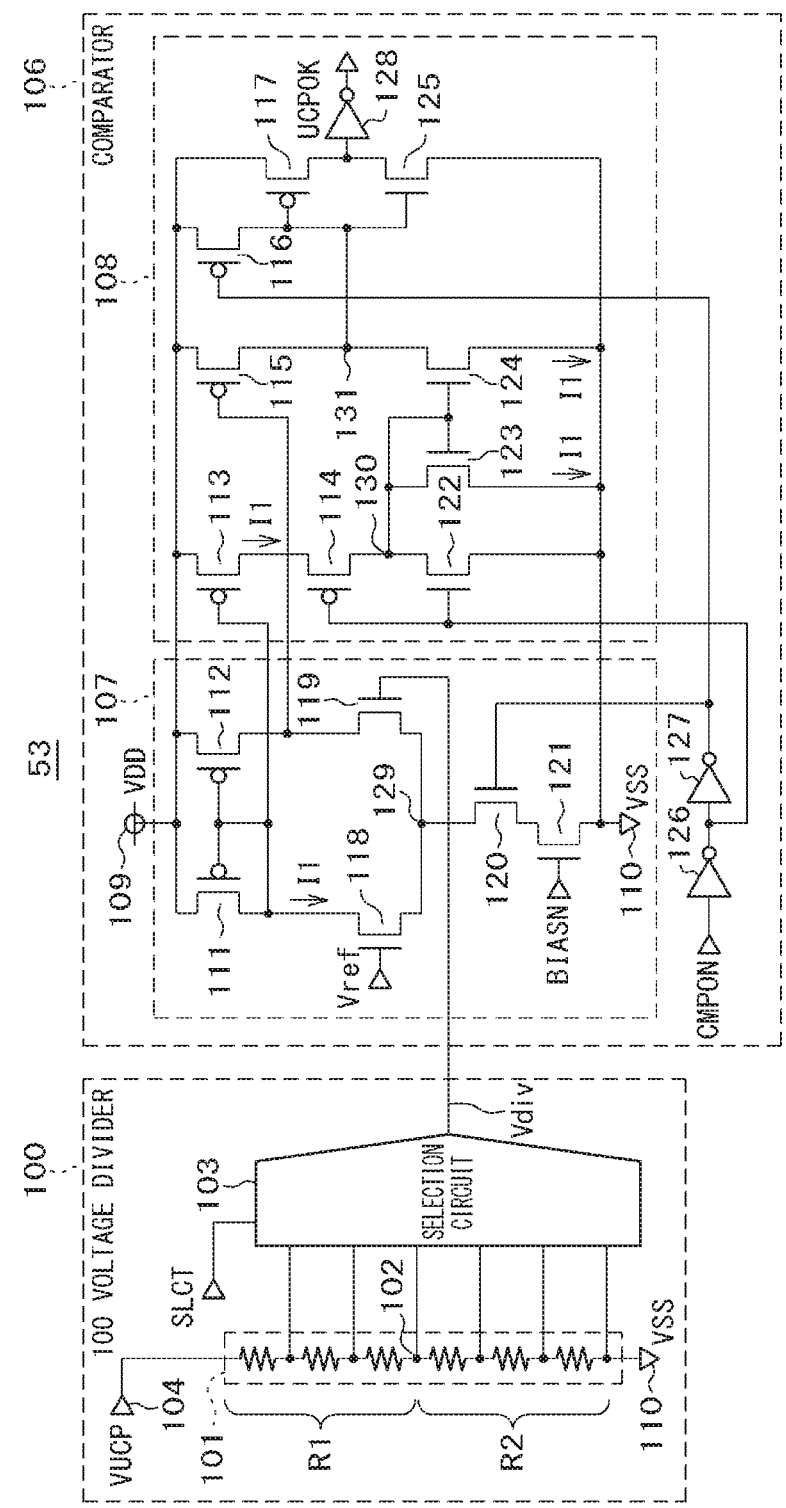
FIG. 14 is a circuitry diagram illustrating an example of a configuration of a voltage detection unit of FIG. 12.

FIG. 14 is a circuit diagram illustrating a configuration example of the voltage detection unit of FIG. 12. By reference to FIG. 14, the voltage detection unit 53 includes a voltage divider 100 and a comparator 106. The voltage divider 100 divides an output voltage (VUCP) (a boosted voltage (VUCP)) of the charge pump circuit 52. The comparator 106 compares the output voltage (divided voltage) of the voltage divider with a reference voltage (Vref).

The voltage divider 100 includes a plurality of resistance elements 101 and a selection circuit 103. The resistance elements 101 are connected in series between the input node 104 to which a boosted voltage (VUCP) is input and a ground node (VSS) 110. The selection circuit 103 selects one connection node of the plurality of resistance elements 101 in response to a selection signal (SLCT), and outputs a voltage of the selected connection node. For example, let it be assumed that a connection node 102 is selected in FIG. 15. At this time, the resistance value between the input node 104 and the connection node 102 is identified as R1, while the resistance value between the connection node 102 and the ground node 110 is identified as R2. In this case, the divided voltage (Vdiv) is obtained by $$Vdiv=VUCP*R2/(R1+R2)$$

Thus, to obtain a large boosted voltage (VUCP), the selection circuit 103 selects the connection node for realizing a decrease in the value R2.

The comparator 106 includes a differential stage 107, an output stage 108, and inverters 126 and 127. The differential stage 107 includes PMOS transistors 111 and 12, and NMOS transistors 118 to 121.

The PMOS transistor 111 and the NMOS transistor 118 are connected in this order in series between a power source node 109 and a node 129. An internal power source voltage (VDD) is supplied to the power source node 109. The PMOS transistor 112 and the NMOS transistor 119 are connected in this order in series between the power source node 109 and the node 129. The gate of the PMOS transistor 112 is connected to the gate and the drain of the PMOS transistor 111. The PMOS transistors 111 and 112 are provided to form a pair of current mirrors. A reference voltage (Vref) is input to the gate of the NMOS transistor 118, while an output voltage (a divided voltage of a boosted voltage (VUCP)) of the voltage divider 100 is input to the gate of the NMOS transistor 119. The NMOS transistors 118 and 119 are provided to form a differential pair.

The NMOS transistors 120 and 121 are connected in this order between the node 129 and the ground node 110. A ground voltage (VSS) is supplied to the ground node 110. An operation signal (CMPON) is input to the gate of the NMOS transistor 120 through the inverters 126 and 127. Thus, the NMOS transistor 120 functions as a switch which is in a conduction state when the operation signal (CMPON) is turned into an activated state (H level). A bias voltage (BIASN) is input to the gate of the NMOS transistor 121. The NMOS transistor 121 functions as a constant current source.

The output stage 108 includes PMOS transistors 113 to 117, NMOS transistors 122 to 125, and an inverter 128. Of these transistors, the PMOS transistor 114 functions as a switch which is in a conduction state when the operation signal (CMPON) is turned into an activated state (H level). The PMOS transistor 116 and the NMOS transistor 112 function as switches which are in a non-conduction state when the operation signal (CMPON) is turned into an activated state (H level).

When the operation signal (CMPON) is in an activated state (H level), the PMOS transistor 113 and the NMOS transistor 123 are connected in series between the power source node 109 and the ground node 110. The PMOS transistor 115 and the NMOS transistor 124 are connected in series between the power source node 109 and the ground node 110, while the PMOS transistor 117 and the NMOS transistor 125 are connected in series between the power source node 109 and the ground node 110.

The PMOS transistor 113 is provided to form a current mirror together with the PMOS transistor 111, while the NMOS transistor 123 is provided to form a current mirror together with the NMOS transistor 124. Thus, an equal current I1 flows through these transistors.

The gate of the PMOS transistor 115 is connected to the drain of the PMOS transistor 112, a drain 131 of the PMOS transistor 115 is connected to the gate of each of the PMOS transistor 117 and the NMOS transistor 125. A signal, which has been obtained by the inverter 128 inverting the voltage of the drain common to the PMOS transistor 117 and the NMOS transistor 125, is output as a control signal (UCPOK).

According to the configuration of the above comparator 106, if the divided voltage (Vdiv) of the output voltage (a boosted voltage (VUCP)) of the voltage divider 100 is greater than the reference voltage (Vref), the current flowing through the NMOS transistor 119 is greater than the current (I1). As a result, the PMOS transistor 115 and the NMOS transistor 125 are turned ON. Thus, the control signal (UCPOK) is at H level. If the divided voltage (Vdiv) set by the selection signal (SLCT), that is, the boosted voltage (VUCP), is greater than the reference voltage (Vref) as a standard voltage, the control signal (UCPOK) is at H level. Further, as described in the description of FIG. 11, the application of the boosted voltage (VUCP) to the source line is completed, and as will be described later in the description of FIG. 15, an erasure end flag 152 is set.

[Configuration of Timing Control Unit]

Figure 15:
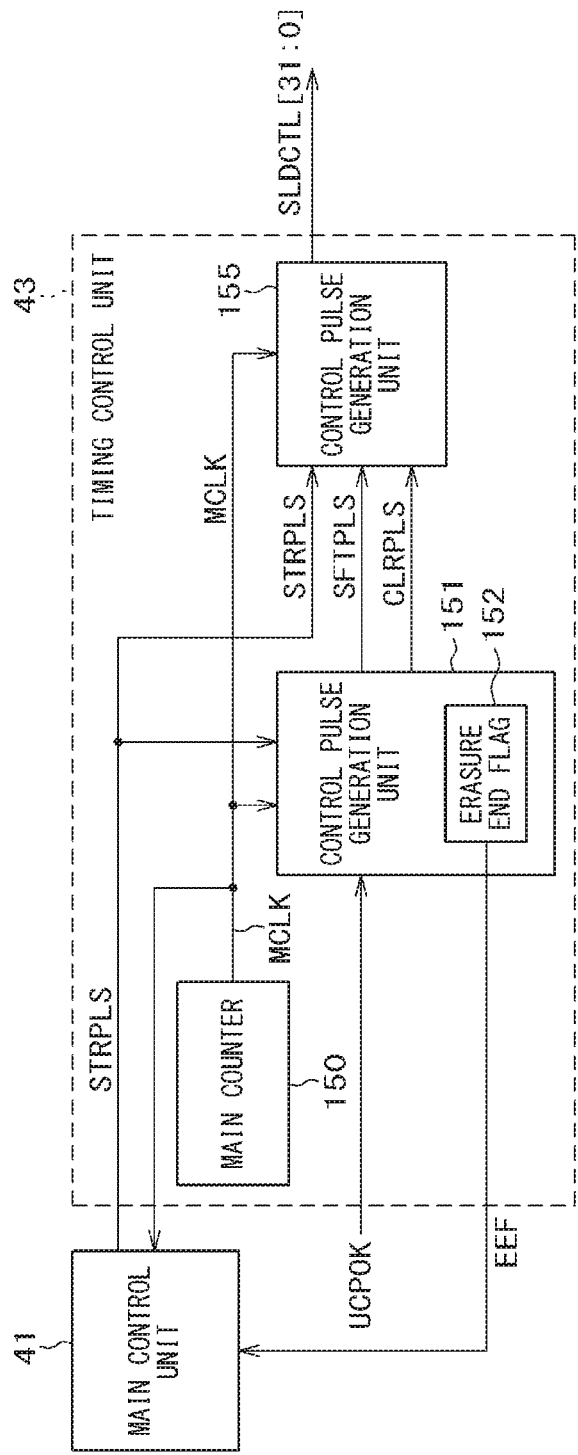
FIG. 15 is a timing diagram illustrating an example of an operation of a driving pulse generation unit of FIG. 12.

FIG. 15 is a block diagram illustrating a configuration of a timing control unit of FIG. 12. By reference to FIG. 15, the timing control unit 43 includes a main counter 150, a control pulse generation unit 151 generating a control pulse signal (a shift pulse (SFTPLS), a clear pulse (CLRPLS)), and a drive pulse generation unit 155 generating a control signal (SLDCTL [31:0]) for driving the source line driver SLD.

The main counter 150 generates a master clock (MCLK) as a standard for the operation of each unit.

The control pulse generation unit 151 outputs a control pulse signal (a shift pulse (SFTPLS), a clear pulse (CLRPLS)) to the drive pulse generation unit 155, in response to a start pulse signal (STRPLS) output from the main control unit 41. The drive pulse generation unit 155 outputs controls signals (SLDCTL0 to SLDCTL31) respectively to the source line drivers SLD0 to SLD31, in response to a control pulse signal (a shift pulse (SFTPLS), a clear pulse (CLRPLS)).

The control signal (UCPOK) output from the voltage detection unit 53 of FIG. 12 is output to the control pulse generation unit 151. Thus, after the shift pulse (SFTPLS) is output, the control pulse generation unit 151 outputs the next shift pulse (SFTPLS) and the clear pulse (CLRPLS), in response that the control signal (UCPOK) is in an activated state (H level).

The erasure end flag 152 incorporated in the control pulse generation unit 151 is provided to measure the application time (Tp) of the erasure voltage in the control unit FCU described in the embodiment. The erasure end flag 152 of the control pulse generation unit 151 is cleared by the H level of the start pulse signal (STRPLS), and reset by the H level of the control signal (UCPOK).

[Erasure Operation of Non-volatile Memory Unit]

Figure 16:
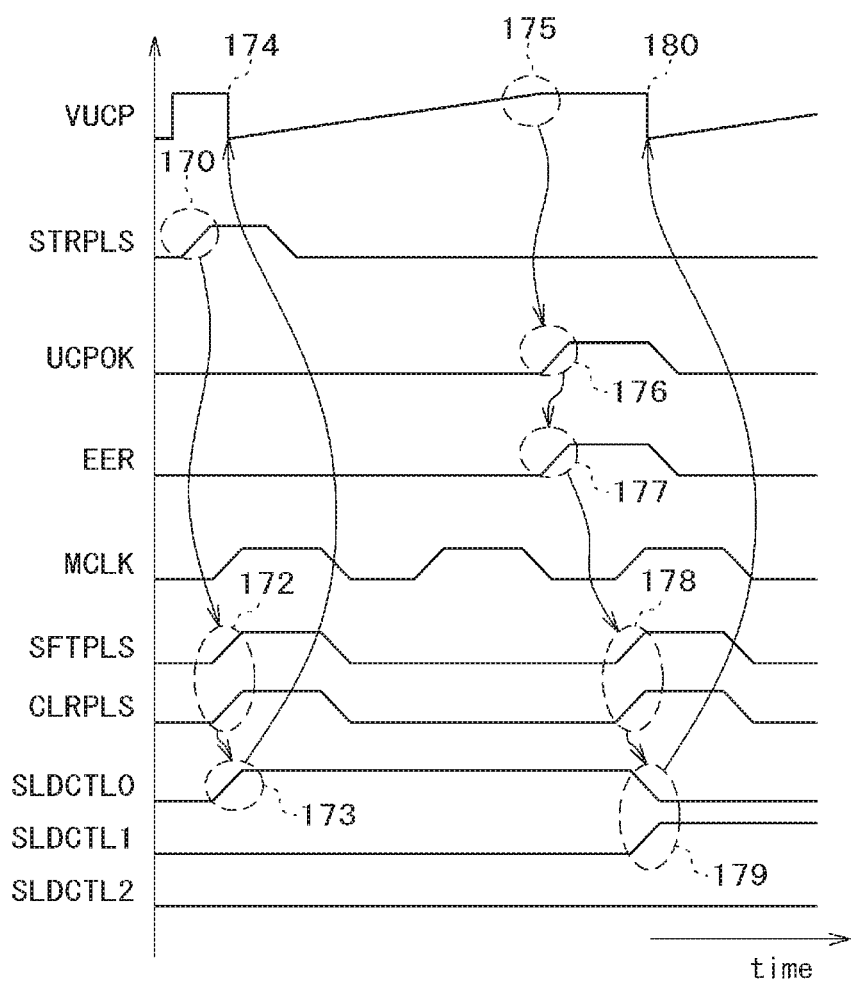
FIG. 16 is a diagram for explaining an erasure operation of the non-volatile memory unit of FIG. 8.

FIG. 16 is a diagram for explaining an erasure operation of the non-volatile memory unit.

By reference to FIG. 15 and FIG. 16, the control pulse generation unit 151 outputs a shift pulse (SFTPLS) and a clear pulse (CLRPLS) (172), if the start pulse signal (STRPLS) is in an activated state (H level) (170). The drive pulse generation unit 155 switches the state of the control signal (SLDCTL0) to be output to the source line driver SLD0, into an activated state (H level) (173), in response to the H level start pulse signal (STRPLS), the shift pulse (SFTPLS), and the clear pulse (CLRPLS). As a result, the output voltage (VUCP) of the charge pump circuit 52 of FIG. 12 is temporarily decreased (174).

If the output voltage (VUCP) of the charge pump circuit 52 is recovered to a target voltage (175), the control signal (UCPOK) output by the voltage detection unit 53 of FIG. 12 is switched into an activated state (H level) (176). The erasure end flag (EEF) 152 is switched into the H level (177), in response to the H level control signal (UCPOK).

The control pulse generation unit 151 outputs the shift pulse (SFTPLS) and the clear pulse (CLRPLS) (178) at a rising timing of the next master clock (MCLK), in response to the H level control signal (UCPOK). In response to the shift pulse (SFTPLS) and the clear pulse (CLRPLS), the drive pulse generation unit 155 switches the state of the control signal (SLDCTL0) output to the source line driver SLD0 into a non-activated state (L level), and switches the state of the control signal (SLDCTL1) output to the source line driver SLD1 into an activated state (H level) (179). As a result, the output voltage (VUCP) of the charge pump circuit 52 of FIG. 12 is temporarily decreased (180).

The same control operation will be performed below over and over.

Accordingly, the descriptions have been made to the present invention by the present inventors, based on the preferred embodiment. The present invention is not limited to the above-described embodiment, and, needless to say, various changes may be made without departing from the scope thereof.

For example, the semiconductor device of the embodiment has been described, for the case of a microcomputer in which a non-volatile memory unit is incorporated. However, it may be a semiconductor memory in which the CPU is not incorporated.

The non-volatile memory unit is configured with the memory unit and the control unit which are separately formed therein. However, the memory unit and the control unit may be integrally formed.

What is claimed is:
1. A semiconductor device comprising:
a memory unit; and
a control unit which controls the memory unit,
wherein the memory unit includes
a memory which is configured with a non-volatile memory device, and stores setting information necessary for rewriting,
a first control circuit which has a first register and a rewrite end flag, and
a power source circuit which generates a rewrite voltage,
wherein the control unit includes
a second control circuit which has a rewrite start flag,
a counter which measures a rewrite voltage application time based on the rewrite start flag and the rewrite end flag, and
a second register which stores a next rewrite voltage based on the rewrite voltage application time, and
wherein, when a command for rewriting the memory is received, the control unit reads the setting information necessary for rewriting from the memory, and writes it back to the first register.

2. The semiconductor device according to claim 1,
wherein the memory includes a memory cell transistor having a charge accumulation unit and storing data based on a change in a threshold voltage in accordance with a charge amount of the charge accumulation unit,
wherein the power source circuit includes
a voltage generation circuit which generates a rewrite voltage to be supplied to one main electrode of the memory cell transistor, at time of a rewriting operation, and
a detection circuit which compares an output voltage of the voltage generation circuit with a reference value,
wherein the first control circuit supplies the rewrite voltage to the main electrode based on the rewrite start flag,
wherein the detection circuit sets the rewrite end flag, when the rewrite voltage is greater than the reference value,
wherein the counter starts counting in accordance with the rewrite start flag, and ends the counting in accordance with the rewrite end flag, and
wherein the second control circuit determines a rewrite voltage to be applied next time to the main electrode, based on a counted result of the counter.

3. The semiconductor device according to claim 2,
wherein the second control circuit p2 decreases a set value of the rewrite voltage, when a counted value of the counter is greater than a predetermined value, and increases the set value of the rewrite voltage, when the counted value of the counter is smaller than the predetermined value.

4. The semiconductor device according to claim 2,
wherein the first control circuit ends supplying the rewrite voltage to the main electrode, when the detection circuit sets the rewrite end flag.

5. The semiconductor device according to claim 2,
wherein the first control circuit decreases a set value of the rewrite voltage to a predetermined value, when the rewrite end flag is not activated, and when a predetermined time has elapsed since start of supply of the rewrite voltage.

6. The semiconductor device according to claim 2,
wherein the second control circuit performs a verification operation, after the rewrite voltage has increased greater than a predetermined voltage.

7. The semiconductor device according to claim 2,
wherein the voltage generation circuit includes a charge pump circuit.

8. A semiconductor device comprising:
a memory cell transistor which has a charge accumulation unit, and stores data based on a change in a threshold voltage in accordance with a charge amount of the charge accumulation unit;
a voltage generation circuit which generates a boosted voltage to be supplied to one main electrode of the memory cell transistor at time of a rewriting operation;
a detection circuit which compares an output voltage of the voltage generation circuit with a reference value; and
a control circuit which controls a timing of supplying the boosted voltage at the time of the rewriting operation;
wherein the control circuit measures a time since start of supply of the boosted voltage until the detection circuit detects that the boosted value is greater than the reference value, and determines a boosted voltage to be applied next time to the main electrode based on the measured time.

9. The semiconductor device according to claim 8,
wherein the control circuit includes
- a start flag which instructs to start supply of the boosted voltage,
- an end flag which represents that the boosted voltage is greater than the reference value,
- a counter which starts counting based on the start flag, and ends the counting based on the end flag, and wherein the control circuit determines an increase/decrease of a boosted voltage to be applied next time based on a counted value of the counter.

10. The semiconductor device according to claim 9,
wherein the control circuit includes a register which stores a set value of the boosted voltage, and
wherein the set value of the boosted voltage corresponds to the reference value.

11. The semiconductor device according to claim 10,
wherein the control circuit
- decreases the set value of the boosted voltage, when the counted value of the counter is greater than a predetermined value, and
- increases the set value of the boosted voltage, when the counted value of the counter is lower than the predetermined value.

12. The semiconductor device according to claim 8,
wherein the control circuit ends supply of the boosted voltage to the main electrode, when the detection circuit detects that the boosted voltage is greater than the reference value.

13. The semiconductor device according to claim 8,
wherein the control circuit decreases the set value of the boosted voltage to a predetermined value, when the end flag is not activated, and when a predetermined time has elapsed since start of supply of the boosted voltage.

14. The semiconductor device according to claim 8,
wherein the control circuit performs a verification operation, after the boosted voltage is increased greater than a predetermined voltage.

15. The semiconductor device according to claim 8,
wherein the memory cell transistor includes
- a control gate,
- a charge accumulation unit,
- a memory gate,
- a drain, and
- a source, wherein the control circuit applies the boosted voltage to the source, at time of an erasure operation using a band-to-band tunneling technique.

16. The semiconductor device according to claim 8,
wherein the voltage generation circuit includes a charge pump circuit.

17. The semiconductor device according to claim 8, further comprising
a memory array which includes a plurality of memory cell transistors, and
wherein the memory array stores a table which includes boosted voltage information at time of the rewriting operation.

18. The semiconductor device according to claim 17, further comprising
a register which stores information of the table.

* * * * *